US009929698B2

(12) United States Patent
Gudem et al.

(10) Patent No.: US 9,929,698 B2
(45) Date of Patent: Mar. 27, 2018

(54) RADIO FREQUENCY INTEGRATED CIRCUIT (RFIC) CHARGED-DEVICE MODEL (CDM) PROTECTION

(71) Applicant: QUALCOMM Incorporated, San Diego, CA (US)

(72) Inventors: Prasad Srinivasa Siva Gudem, San Diego, CA (US); Himanshu Khatri, Laguna Niguel, CA (US); Devavrata V Godbole, Carlsbad, CA (US); Eugene Robert Worley, Irvine, CA (US)

(73) Assignee: QUALCOMM Incorporated, San Diego, CA (US)

( * ) Notice: Subject to any disclaimer, the term of this patent is extended or adjusted under 35 U.S.C. 154(b) by 496 days.

(21) Appl. No.: 13/841,239

(22) Filed: Mar. 15, 2013

(65) Prior Publication Data
US 2014/0268447 A1    Sep. 18, 2014

(51) Int. Cl.
| | |
|---|---|
| H02H 9/00 | (2006.01) |
| H03F 1/22 | (2006.01) |
| H01L 27/02 | (2006.01) |
| H03F 1/52 | (2006.01) |
| H03F 3/193 | (2006.01) |
| H02H 9/04 | (2006.01) |

(52) U.S. Cl.
CPC ......... *H03F 1/223* (2013.01); *H01L 27/0255* (2013.01); *H02H 9/046* (2013.01); *H03F 1/523* (2013.01); *H03F 3/193* (2013.01); *H03F 2200/489* (2013.01)

(58) Field of Classification Search
USPC .......................................................... 361/56
See application file for complete search history.

(56) References Cited

U.S. PATENT DOCUMENTS

| | | | | |
|---|---|---|---|---|
| 4,831,424 A | * | 5/1989 | Yoshida .............. | H01L 27/0255 257/328 |
| 5,119,162 A | * | 6/1992 | Todd ................. | H01L 21/82345 257/273 |
| 5,276,350 A | | 1/1994 | Merrill et al. | |
| 5,917,220 A | * | 6/1999 | Waggoner .......... | H01L 27/0251 257/355 |
| 6,268,242 B1 | * | 7/2001 | Williams ......... | H03K 17/04123 257/331 |

(Continued)

FOREIGN PATENT DOCUMENTS

| | | |
|---|---|---|
| CN | 101819972 A | 9/2010 |
| CN | 102255300 A | 11/2011 |

(Continued)

OTHER PUBLICATIONS

Machine Translation of JP 2009/253699.*

(Continued)

*Primary Examiner* — Ronald W Leja
(74) *Attorney, Agent, or Firm* — Haynes and Boone, LLP

(57) ABSTRACT

An apparatus is described. The apparatus includes an input device. The apparatus also includes a positive supply voltage pad. The apparatus further includes an input signal pad. The apparatus also includes a ground pad. The apparatus further includes charged-device model protection circuitry that protects the input device from electrostatic discharge. The charged-device model protection circuitry includes at least one of de-Q circuitry and a cascode device.

17 Claims, 12 Drawing Sheets

(56) References Cited

U.S. PATENT DOCUMENTS

| | | | |
|---|---|---|---|
| 6,404,269 B1* | 6/2002 | Voldman | H01L 27/0255 327/534 |
| 7,233,467 B2 | 6/2007 | Mergens et al. | |
| 8,133,765 B2 | 3/2012 | Hodel et al. | |
| 2001/0043449 A1 | 11/2001 | Okushima | |
| 2002/0019099 A1* | 2/2002 | Williams | H01L 27/0255 438/270 |
| 2002/0071230 A1* | 6/2002 | Colclaser | H01L 27/0266 361/56 |
| 2003/0102923 A1 | 6/2003 | Vickram et al. | |
| 2008/0290367 A1* | 11/2008 | Su | H01L 27/0255 257/173 |
| 2009/0128223 A1* | 5/2009 | Lui | H01L 27/0255 327/513 |
| 2010/0103572 A1 | 4/2010 | Worley | |
| 2010/0200920 A1* | 8/2010 | Su | H01L 27/0255 257/355 |
| 2011/0051301 A1 | 3/2011 | Thijs et al. | |
| 2011/0176245 A1 | 7/2011 | Worley et al. | |
| 2011/0286136 A1 | 11/2011 | Tsai | |
| 2012/0176709 A1 | 7/2012 | Tsai et al. | |
| 2014/0268446 A1* | 9/2014 | Gudem | H02H 9/041 361/56 |
| 2014/0268447 A1* | 9/2014 | Gudem | H01L 27/0255 361/56 |

FOREIGN PATENT DOCUMENTS

| | | |
|---|---|---|
| JP | 2002043533 A | 2/2002 |
| JP | 2009253699 A * | 10/2009 |
| WO | 03049281 A1 | 6/2003 |

OTHER PUBLICATIONS

International Search Report and Written Opinion—PCT/US2014/022816—ISA/EPO—dated Jun. 12, 2014

Yuan-Wen Hsiao et al: "An ESD-protected 5-GHz differential low-noise amplifier in a 130-nm CMOS process" Custom Integrated Circuits Conference, 2008. CICC 2008. IEEE, IEEE, Piscataway, NJ, USA, Sep. 21, 2008 (Sep. 21, 2008), pp. 233-236, XP031361452 ISBN: 978-1-4244-2018-6 p. 234, left-hand column, line 3—p. 236, right-hand column, line 21; figures 2,3,4.

Kaamouchi, et al., "A 2.4-GHz Fully Integrated ESD-Protected Low-Noise Amplifier in 130-nm PD SOI CMOS Technology", IEEE Transactions on Microwave Theory and Techniques, 55(12), doi: 10.1109/TMTT.2007.909148, 2007, pp. 2822-2831.

Maloney T., "Designing MOS inputs and outputs to avoid oxide failure in the charged device model," in Proc. EOS/ESD Symp., 1988, pp. 220-227.

* cited by examiner

RADIO FREQUENCY INTEGRATED CIRCUIT (RFIC) CHARGED-DEVICE MODEL (CDM) PROTECTION

TECHNICAL FIELD

The present disclosure relates generally to wireless devices for communication systems. More specifically, the present disclosure relates to systems and methods for radio frequency integrated circuit (RFIC) charged-device model (CDM) protection.

BACKGROUND

Electronic devices (cellular telephones, wireless modems, computers, digital music players, Global Positioning System units, Personal Digital Assistants, gaming devices, etc.) have become a part of everyday life. Small computing devices are now placed in everything from automobiles to housing locks. The complexity of electronic devices has increased dramatically in the last few years. For example, many electronic devices have one or more processors that help control the device, as well as a number of digital circuits to support the processor and other parts of the device.

Amplifiers are commonly used in various electronics devices to provide signal amplification. Different types of amplifiers are available for different uses. For example, a wireless communication device such as a cellular phone may include a transmitter and a receiver for bi-directional communication. The receiver may utilize a low noise amplifier (LNA), the transmitter may utilize a power amplifier (PA) and the receiver and transmitter may both utilize variable gain amplifiers (VGAs).

Amplifiers may be fabricated with various integrated circuit (IC) processes. Sub-micron complementary metal oxide semiconductor (CMOS) fabrication processes are commonly used for radio frequency (RF) circuits in wireless devices and other electronic devices in order to reduce cost and improve integration. However, transistors fabricated with sub-micron CMOS processes typically have small physical dimensions and are more susceptible to stress and possibly failure due to electrostatic discharge (ESD). ESD is a sudden large and momentary electrical charge that may come from static electricity and/or other sources. It is desirable to effectively combat ESD while minimally affecting performance.

SUMMARY

An apparatus is described. The apparatus includes an input device, a positive supply voltage pad, an input signal pad, a ground pad and charged-device model protection circuitry. The charged-device model protection circuitry protects the input device from electrostatic discharge. The charged-device model protection circuitry includes at least one of de-Q circuitry and a cascode device. The cascode device is triggered on by a trigger voltage.

The charged-device model protection circuitry may include de-Q circuitry. The de-Q circuitry may include a resistor and a diode in series. The input device may include an n-channel transistor. The resistor may be coupled to a source of the n-channel transistor. A cathode of the diode may be coupled to a gate of the n-channel transistor.

The de-Q circuitry may limit current through a parasitic path of the n-channel transistor, reducing voltage buildup between the gate of the n-channel transistor and the source of the n-channel transistor. The de-Q circuitry may direct electrostatic discharge through a +ve diode coupled between the ground pad and the input signal pad. The de-Q circuitry may keep a voltage from the gate of the n-channel transistor to the source of the n-channel transistor less than a voltage difference between the input signal pad and a local ground node on the apparatus.

The charged-device model protection circuitry comprises a cascode device. The cascode device may turn on the input device during −ve electrostatic discharge. The cascode may include a first n-channel transistor. A gate of the first n-channel transistor may be coupled to an RC clamp trigger voltage. A source of the first n-channel transistor may be coupled to a drain of the input device. Turning on the input device may increase a source potential of the input device, protecting the gate-to-source of the input device.

A method for electrostatic discharge protection is also described. A +ve voltage pulse is detected at a ground pad. Current is conducted through a +ve diode coupled between the ground pad and an input signal pad. A voltage drop is generated across a degeneration inductor coupled between an input device and the ground pad. Current passing from a source of the input device to a gate of the input device is limited using de-Q circuitry. A voltage from the gate of the input device to the source of the input device is maintained that is below a failure point for the input device.

A method for electrostatic discharge protection is described. A −ve voltage pulse is detected at an input signal pad. Current is conducted through a −ve diode coupled between the input signal pad and a local supply node. The −ve current is steered to a ground pad via an RC clamp. A cascode device is turned on using an RC clamp trigger voltage from the RC clamp. An input device is turned on using the cascode device. A voltage from a gate of the input device to a source of the input device that is below a failure point for the input device is maintained.

An apparatus for electrostatic discharge protection is also described. The apparatus includes means for detecting a +ve voltage pulse at a ground pad. The apparatus also includes means for conducting current through a +ve diode coupled between the ground pad and an input signal pad. The apparatus further includes means for generating a voltage drop across a degeneration inductor coupled between an input device and the ground pad. The apparatus also includes means for limiting current passing from a source of the input device to a gate of the input device. The apparatus further includes means for maintaining a voltage from the gate of the input device to the source of the input device that is below a failure point for the input device.

An apparatus for electrostatic discharge protection is described. The apparatus includes means for detecting a −ve voltage pulse at an input signal pad. The apparatus also includes means for conducting current through a −ve diode coupled between the input signal pad and a local supply node. The apparatus further includes means for steering −ve current to a ground pad via an RC clamp. The apparatus also includes means for turning on a cascode device using an RC clamp trigger voltage from the RC clamp. The apparatus further includes means for turning on an input device using the cascode device. The apparatus also includes means for maintaining a voltage from a gate of the input device to a source of the input device that is below a failure point for the input device.

DETAILED DESCRIPTION

Figure 1:
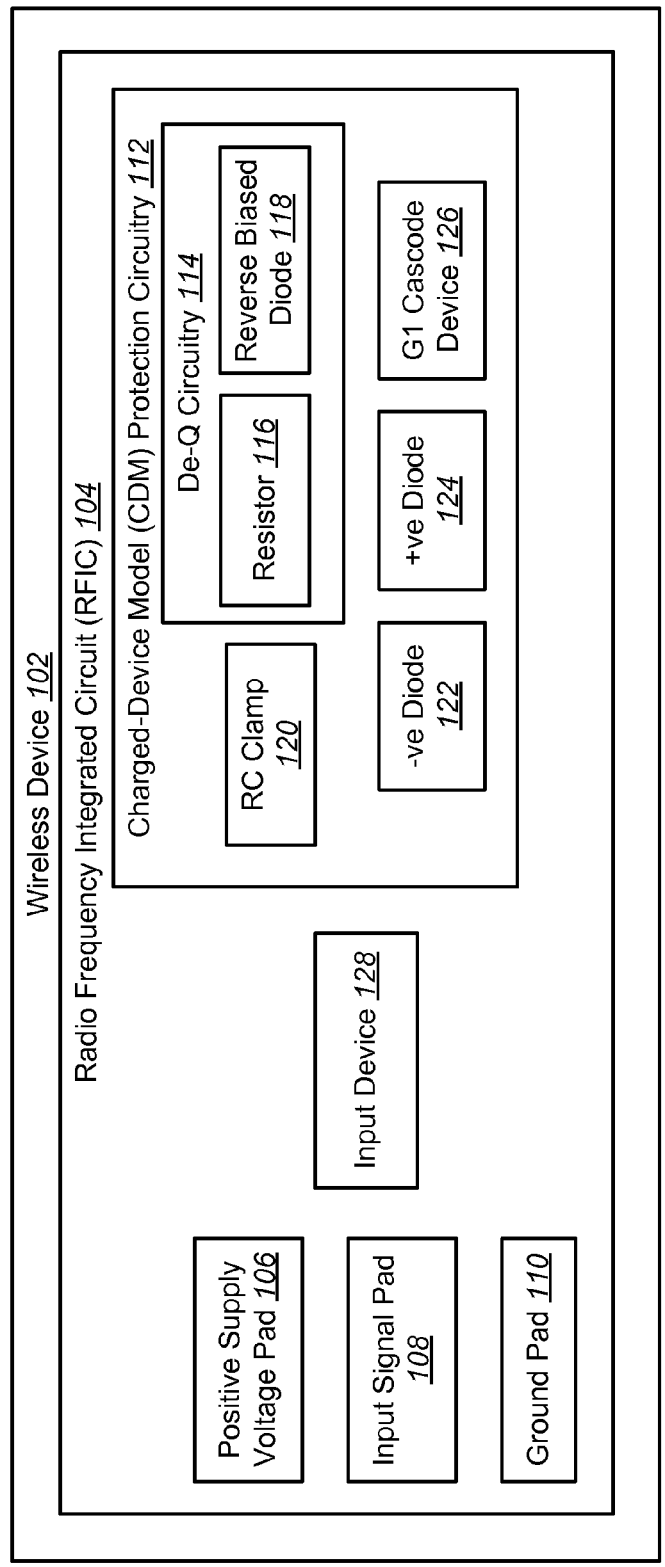
FIG. 1 shows a wireless device for use in the present systems and methods.

FIG. 1 shows a wireless device 102 for use in the present systems and methods. The wireless device 102 may include a radio frequency integrated circuit (RFIC) 104 that includes advanced charged-device model (CDM) protection circuitry 112. Advanced charged-device model (CDM) protection circuitry 112 may allow the radio frequency integrated circuit (RFIC) 104 to pass charged-device model (CDM) testing without compromising performance (e.g., by avoiding degrading input match, noise figure (NF) or linearity).

A wireless device 102 may be a wireless communication device or a base station. A wireless communication device may also be referred to as, and may include some or all of the functionality of, a terminal, an access terminal, a user equipment (UE), a subscriber unit, a station, etc. A wireless communication device may be a cellular phone, a personal digital assistant (PDA), a wireless device, a wireless modem, a handheld device, a laptop computer, a PC card, compact flash, an external or internal modem, a wireline phone, etc. A wireless communication device may be mobile or stationary. A wireless communication device may communicate with zero, one or multiple base stations on a downlink and/or an uplink at any given moment. The downlink (or forward link) refers to the communication link from a base station to a wireless communication device, and the uplink (or reverse link) refers to the communication link from a wireless communication device to a base station. Uplink and downlink may refer to the communication link or to the carriers used for the communication link.

A wireless communication device may operate in a wireless communication system that includes other wireless devices 102, such as base stations. A base station is a station that communicates with one or more wireless communication devices. A base station may also be referred to as, and may include some or all of the functionality of, an access point, a broadcast transmitter, a Node B, an evolved Node B, etc. Each base station provides communication coverage for a particular geographic area. A base station may provide communication coverage for one or more wireless communication devices. The term "cell" can refer to a base station and/or its coverage area, depending on the context in which the term is used.

Communications in a wireless communication system (e.g., a multiple-access system) may be achieved through transmissions over a wireless link. Such a communication link may be established via a single-input and single-output (SISO) or a multiple-input and multiple-output (MIMO) system. A multiple-input and multiple-output (MIMO) system includes transmitter(s) and receiver(s) equipped, respectively, with multiple transmit antennas (NT) and multiple receive antennas (NR) for data transmission. SISO systems are particular instances of a multiple-input and multiple-output (MIMO) system. The multiple-input and multiple-output (MIMO) system can provide improved performance (e.g., higher throughput, greater capacity or improved reliability) if the additional dimensionalities created by the multiple transmit and receive antennas are utilized.

The wireless communication system may utilize both single-input and multiple-output (SIMO) and multiple-input and multiple-output (MIMO). The wireless communication system may be a multiple-access system capable of supporting communication with multiple wireless communication devices by sharing the available system resources (e.g., bandwidth and transmit power). Examples of such multiple-access systems include code division multiple access (CDMA) systems, wideband code division multiple access (W-CDMA) systems, time division multiple access (TDMA) systems, frequency division multiple access (FDMA) systems, orthogonal frequency division multiple access (OFDMA) systems, single-carrier frequency division multiple access (SC-FDMA) systems, $3^{rd}$ Generation Partnership Project (3GPP) Long Term Evolution (LTE) systems and spatial division multiple access (SDMA) systems.

The wireless device 102 may include a radio frequency integrated circuit (RFIC) 104. The radio frequency integrated circuit (RFIC) 104 may include radio frequency (RF) components, such as an input device 128. One example of an input device 128 is an amplifier. An amplifier may be a low noise amplifier (LNA), a direct amplifier (DA) or a power amplifier (PA). An input device 128 (such as a low noise amplifier (LNA)) may have internal matching. An amplifier on a radio frequency integrated circuit (RFIC) 104 may receive input signals from devices that are external to the radio frequency integrated circuit (RFIC) 104 (such as a modem or an antenna on the wireless device 102). Thus, the input device 128 may have inputs coupled to integrated circuit (IC) pins. In one configuration, the input device 128 may be coupled to multiple IC pins (e.g., a positive supply voltage pad 106, an input signal pad 108 and a ground pad 110). These IC pins may be susceptible to electrostatic discharge (ESD), which may damage the circuits (e.g., the input device 128) coupled to the IC pins.

To avoid damage to the input device 128 by electrostatic discharge (ESD), the radio frequency integrated circuit (RFIC) 104 may include charged-device model (CDM) protection circuitry 112. The charged-device model (CDM) protection circuitry 112 may provide protection for +ve charged-device model (CDM) testing and −ve charged-device model (CDM) testing. The charged-device model (CDM) protection circuitry 112 may include an RC clamp 120, a +ve diode 124 and a −ve diode 122. All diodes used herein may be gated diodes or shallow trench isolation (STI) diodes. The charged-device model (CDM) protection circuitry 112 may also include de-Q circuitry 114 and a G1 cascode device 126. The de-Q circuitry 114 may be current limiting circuitry.

During the initial setup of charged-device model (CDM) testing, the device under test (DUT), which is the radio frequency integrated circuit (RFIC) 104 in this case, is placed on an insulated field plate, which is charged to a certain voltage. Typically, this voltage is +500 volts (V) or −500 V, which ensures that the radio frequency integrated circuit (RFIC) 104 is robust against most of the electrostatic discharge (ESD) events generated during automated assembly. The ground plane of the radio frequency integrated circuit (RFIC) 104 also requires the same test voltage as the field plate, and there is not a charge stored between the radio frequency integrated circuit (RFIC) 104 and the field plate. During the testing phase, one of the pins on the radio frequency integrated circuit (RFIC) 104 is shorted to ground. At that instance, the potential difference between the shorted pin and the ground plane equals the test voltage, which can damage the low power devices on the radio frequency integrated circuit (RFIC) 104. The inputs to a low noise amplifier (LNA) are particularly vulnerable, as in the common source configuration, the transistor gate is coupled to the input pad while the source is coupled to the ground pad. Hence, potential quickly develops across the gate-oxide, which can damage the transistor. Thus, additional electrostatic discharge (ESD) circuitry may be required to prevent such damage and facilitate a low impedance path for the discharge current.

In +ve charged-device model (CDM) testing, the electrostatic discharge (ESD) current path is from the ground pad 110 to the input signal pad 108. In −ve charged-device model (CDM) testing, the electrostatic discharge (ESD) current path is from the input signal pad 108 to the negatively charged ground pad 110. For typical radio frequency integrated circuit (RFIC) 104 chip sizes and charged-device model (CDM) testers, a peak discharge current of approximately 5 amperes (A) is expected for the +/−500 V test. A diode 122, 124 in the charged-device model (CDM) protection circuitry 112 may clamp the voltage at approximately 3 V for 5 A of peak charged-device model (CDM) testing.

In current understandings, the resistance in the electrostatic discharge (ESD) path is kept at below 0.5 ohms (i.e., a voltage drop of less than 2.5 V for 5 A of current). Thus, the total voltage across the input device 128 (e.g., from the gate to source of a transistor in the input device 128) may be approximately 5.5 V (the breakdown of the input device 128 is dependent on the technology used). By keeping the resistance in the +ve electrostatic discharge (ESD) path below 0.5 ohms and sizing the +ve diode 124 appropriately, the +ve 500 V charged-device model (CDM) test can easily be passed. Likewise, by keeping the resistance in the −ve electrostatic discharge (ESD) path below 0.5 ohms and sizing both the RC clamp 120 and the −ve diode 122 appropriately, the −ve 500 V charged-device model (CDM) test can easily be passed.

To further improve the charged-device model (CDM) protection circuitry 112 for +ve charged-device model (CDM) testing, the charged-device model (CDM) protection circuitry 112 may include de-Q circuitry 114. The de-Q circuitry 114 may include a resistor 116 and a diode 118. The diode 118 may be reverse biased during normal operation, with a negligible impact on the receiver performance. Due to the design of the charged-device model (CDM) protection circuitry 112, resonance may occur between the gate-source capacitance of the input device 128 and the source degeneration inductance during +ve charged-device model (CDM) testing, causing failures of the input device 128 at lower than expected +ve charged-device model (CDM) voltages (causing the radio frequency integrated circuit (RFIC) 104 to fail the +ve charged-device model (CDM) test). The de-Q circuitry 114 may prevent this resonance from occurring. The de-Q circuitry 114 is discussed in additional detail below in relation to FIG. 2.

To further improve the charged-device model (CDM) protection circuitry 112 for −ve charged-device model (CDM) testing, the charged-device model (CDM) protection circuitry 112 may also include a G1 cascode device 126. During a −ve charged-device model (CDM) test, larger voltages are built up across the gate and source of the input device 128 than during a +ve charged-device model (CDM) test, since the charged-device model (CDM) discharge must flow through the −ve diode 122, the RC clamp 120 and parasitic inductances. This increased voltage may cause the input device 128 to fail during a −ve charged-device model (CDM) test (thus causing the radio frequency integrated circuit (RFIC) 104 to fail the −ve charged-device model (CDM) test). The G1 cascode device 126 may be triggered by an RC clamp trigger voltage from the RC clamp 120. When the G1 cascode device 126 is triggered, the G1 cascode device 126 will directly couple the drain of the input device 128 to the voltage Vdd, and hence put the input device 128 in saturation, thus providing additional protection during the −ve charged-device model (CDM) test. The G1 cascode device 126 is discussed in additional detail below in relation to FIG. 6.

Figure 2:
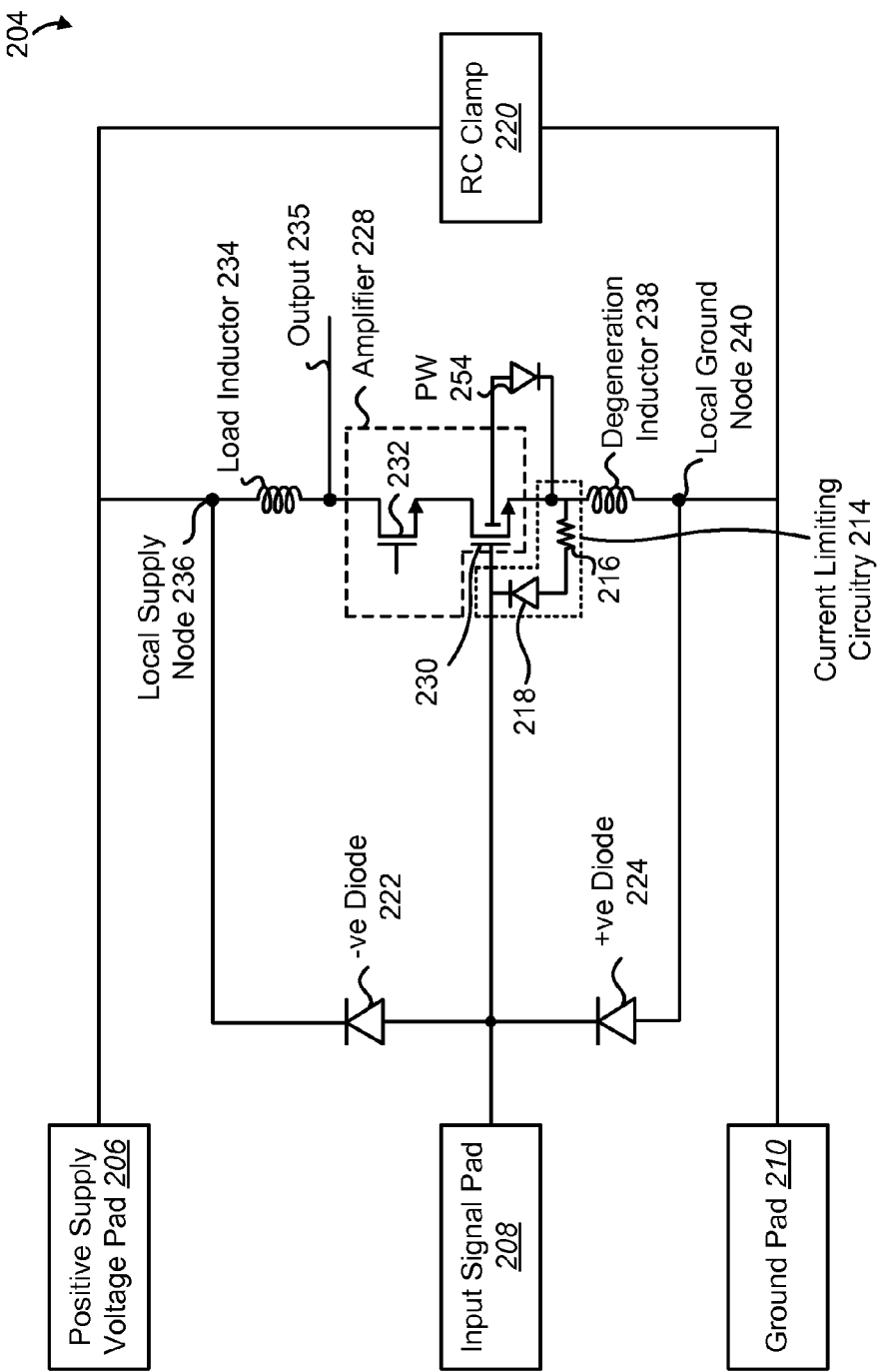
FIG. 2 is a simplified circuit diagram of a radio frequency integrated circuit (RFIC) receiver's low noise amplifier (LNA) that includes de-Q circuitry.

FIG. 2 is a simplified circuit diagram of a radio frequency integrated circuit (RFIC) 204 receiver's low noise amplifier (LNA) that includes de-Q circuitry 214. The radio frequency integrated circuit (RFIC) 204 of FIG. 2 may be one configuration of the radio frequency integrated circuit (RFIC) 104 of FIG. 1. The radio frequency integrated circuit (RFIC) 204 may be a receiver low noise amplifier (LNA). The radio frequency integrated circuit (RFIC) 204 of FIG. 2 does not include models of parasitics that may occur in the radio frequency integrated circuit (RFIC) 204. The radio frequency integrated circuit (RFIC) 204 may include an amplifier 228 (i.e., an input device 128), a positive supply voltage pad 206, an input signal pad 208, a ground pad 210, a +ve diode 224, a −ve diode 222, an RC clamp 220, a load inductor 234 and a degeneration inductor 238. The amplifier 228 may include a first n-channel transistor 230 and a second n-channel transistor 232. In some configurations, the second n-channel transistor 232 may be referred to as the main cascode device.

The drain of the second n-channel transistor 232 may be coupled to a local supply node 236 via the load inductor 234. Between the load inductor 234 and the drain of the second n-channel transistor 232 is the output 235 of the radio frequency integrated circuit (RFIC) 204, which may be provided to a downconverter. The local supply node 236 may be coupled to the positive supply voltage pad 206. The cathode of the −ve diode 222 may be coupled to the local supply node 236. The anode of the −ve diode 222 may be coupled to the input signal pad 208. The ground pad 210 may be coupled to a local ground node 240. The anode of the +ve diode 224 may also be coupled to the local ground node 240. The cathode of the +ve diode 224 may be coupled to the input signal pad 208. The input signal pad 208 may also be coupled to the gate of the first n-channel transistor 230.

The drain of the first n-channel transistor 230 may be coupled to the source of the second n-channel transistor 232. The gate of the second n-channel transistor 232 may be coupled to DC bias circuitry (not shown). The source of the first n-channel transistor 230 may be coupled to the local ground node 240 via the degeneration inductor 238. The RC clamp 220 may be coupled between the local supply node 236 and the local ground node 240. The body of the first n-channel transistor 230 may also be coupled to the anode of a parasitic diode PW 254. The cathode of the parasitic diode PW 254 may be coupled to the source of the first n-channel transistor 230.

Figure 3:
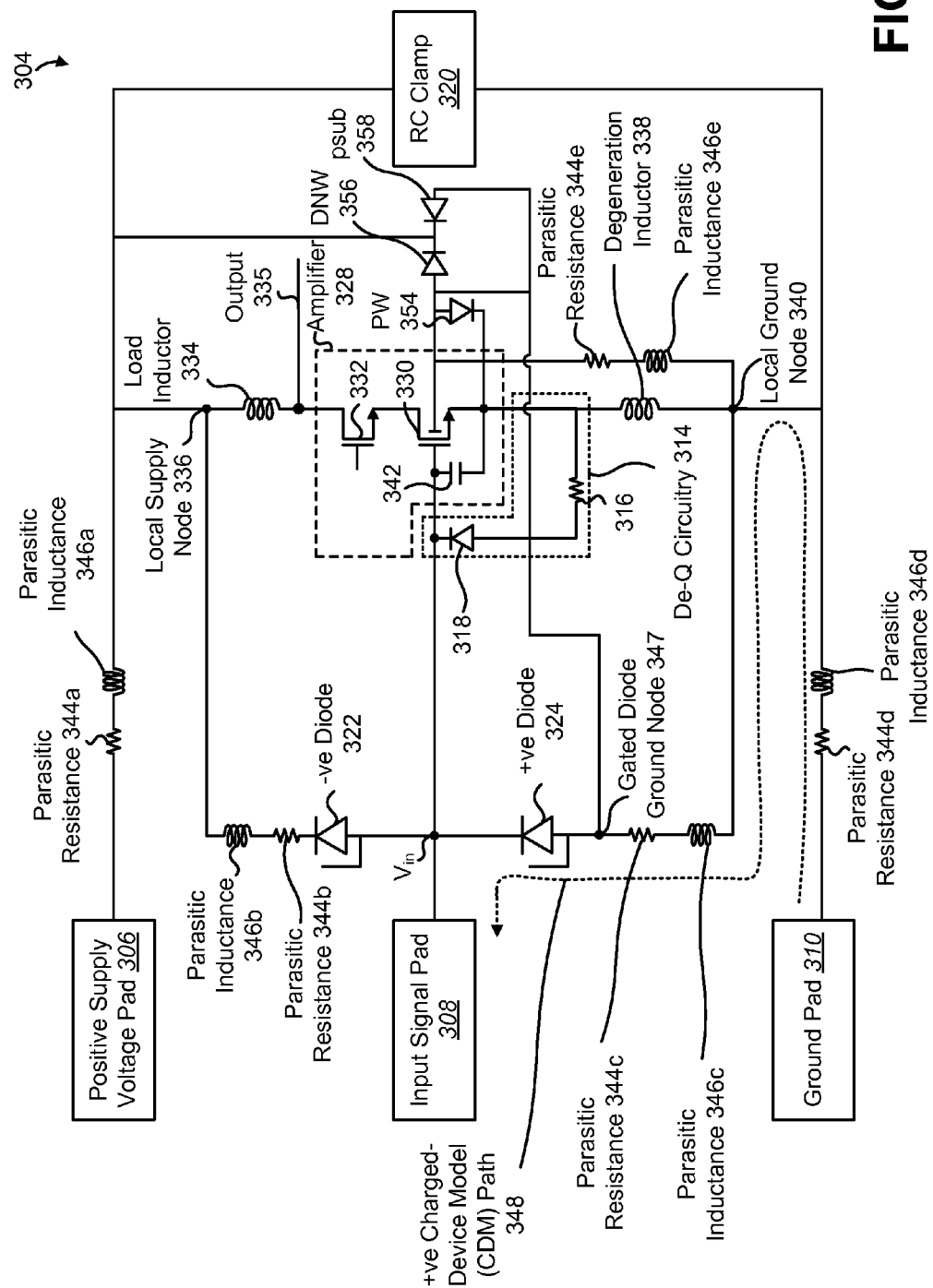
FIG. 3 is a more detailed circuit diagram of a radio frequency integrated circuit (RFIC) receiver's low noise amplifier (LNA) that includes de-Q circuitry.

The de-Q circuitry 214 may include a resistor 216 and a diode 218 in series. The diode 218 may be a gated diode or a shallow trench isolation (STI) diode. The diode 218 may be reverse biased during normal operation, with a negligible impact on the receiver performance. The resistor 216 may be coupled between the source of the first n-channel transistor 230 and the anode of the diode 218. The cathode of the diode 218 is coupled to the gate of the first n-channel transistor 230. Parasitics (such as parasitic capacitances, parasitic resistances and parasitic inductances) inherent in the radio frequency integrated circuit (RFIC) 204 are illustrated in FIG. 3 and left out of FIG. 2 for simplicity. The function of the de-Q circuitry 214 is discussed below in relation to FIG. 3.

FIG. 3 is a more detailed circuit diagram of a radio frequency integrated circuit (RFIC) 304 receiver's low noise amplifier (LNA) that includes de-Q circuitry 314. Specifically, the radio frequency integrated circuit (RFIC) 304 of FIG. 3 includes parasitics that are inherent in an integrated circuit. The radio frequency integrated circuit (RFIC) 304 may be a receiver low noise amplifier (LNA). The radio frequency integrated circuit (RFIC) 304 may include an amplifier 328 (i.e., an input device 128 as shown in FIG. 1), a positive supply voltage pad 306, an input signal pad 308, a ground pad 310, a +ve diode 324, a -ve diode 322, an RC clamp 320, a load inductor 334 and a degeneration inductor 338. The amplifier 328 may include a first n-channel transistor 330 and a second n-channel transistor 332. In some configurations, the second n-channel transistor 332 may be referred to as the main cascode device. The parasitics illustrated in FIG. 3 are only models and do not represent actual components within the radio frequency integrated circuit (RFIC) 304. The main charged-device model (CDM) current discharge path 348 for the +ve charged-device model (CDM) test voltage is illustrated from the ground pad 310 to the input signal pad 308.

The load inductor 334 may be coupled between the drain of the second n-channel transistor 332 and a local supply node 336. Between the load inductor 334 and the drain of the second n-channel transistor 332 is the output 335 of the radio frequency integrated circuit (RFIC) 304, which may be provided to a downconverter. The local supply node 336 may be coupled to the positive supply voltage pad 306 via a coupling wire that includes a parasitic resistance 344a and a parasitic inductance 346a. Because the die area occupied by the passive components in an integrated circuit (e.g., the inductors) are typically much larger than that of the active components (e.g., the transistors), the wires used to couple components on the radio frequency integrated circuit (RFIC) 304 may include significant parasitic resistance 344 and significant parasitic inductance 346 (depending on the length of coupling wires).

The cathode of the -ve diode 322 may be coupled to the local supply node 336 via a coupling wire that includes a parasitic inductance 346b and a parasitic resistance 344b. The anode of the -ve diode 322 may be coupled to the input signal pad 308. The voltage at the input signal pad 308 may be referred to as the voltage Vin. The input signal pad 308 may also be coupled to the cathode of the +ve diode 324. The anode of the +ve diode 324 may be coupled to a local ground node 340 via a coupling wire that includes a parasitic resistance 344c and a parasitic inductance 346c. The node at the anode of the +ve diode 324 may be referred to as the diode ground node 347. The voltage at the local ground node 340 may be referred to as Vgnd.

The ground pad 310 may be coupled to the local ground node 340 via a coupling wire that includes a parasitic resistance 344d and a parasitic inductance 346d. The degeneration inductor 338 may be coupled between the local ground node 340 and the source of the first n-channel transistor 330. The input signal pad 308 may also be coupled to the gate of the first n-channel transistor 330. The body of the first n-channel transistor 330 may also be coupled to the anode of a parasitic diode PW 354. The cathode of the parasitic diode PW 354 may be coupled to the source of the first n-channel transistor 330. This diode 354 represents the p-n junction formed between the p-type body and the n+ source. The first n-channel transistor 330 may be placed in a deep n-well. In this scenario, the body of the first n-channel transistor 330 may be coupled to the anode of a parasitic diode DNW 356. The cathode of the parasitic diode DNW 356 may be coupled to the local supply node 336. Here, the parasitic diode DNW 356 represents the p-n junction diode formed between the p-type body and the n-type nwell. The body of the first n-channel transistor 330 may be coupled to the local ground node 340 via a coupling wire that includes a parasitic resistance 344e and a parasitic inductance 346e.

The anode of a parasitic diode psub 358 may be coupled to the diode ground node 347. The cathode of the parasitic diode psub 358 may be coupled to the cathode of the parasitic diode DNW 356. Here, the parasitic diode psub 358 represents the p-n junction diode formed between the p-type substrate and the deep nwell.

The drain of the first n-channel transistor 330 may be coupled to the source of the second n-channel transistor 332. The source of the first n-channel transistor 330 may be coupled to the degeneration inductor 338. The RC clamp 320 may be coupled between the local supply node 336 and the local ground node 340. A parasitic capacitance Cgs 342, which represents the gate-source capacitance, may occur between the gate of the first n-channel transistor 330 and the source of the first n-channel transistor 330. Without the de-Q circuitry 314, the degeneration inductor 338 and the parasitic capacitance Cgs 342 may resonate, generating a higher voltage across the parasitic capacitance Cgs 342 than the potential building up between the voltage Vin at the input signal pad 308 and the voltage Vgnd at the local ground node 340, causing failures of the input device 128 at lower than expected +ve charged-device model (CDM) voltages.

The de-Q circuitry 314 may include a resistor 316 and a diode 318 in series. The diode 318 may be reverse biased during normal operation, with a negligible impact on the receiver performance. The resistor 316 may be coupled between the source of the first n-channel transistor 330 and the anode of the diode 318. The cathode of the diode 318 may be coupled to the gate of the first n-channel transistor 330. The main purpose of the resistor 316 and the diode 318 is to reduce the resonance between the parasitic capacitance Cgs 342 and the degeneration inductor 338 by rendering the source as a low impedance node. Typically, prior art teaches to limit resistance in the +ve charged-device model (CDM) path. This is done to limit the gate-to-source voltage of the input device 128 (e.g., the first n-channel transistor 330).

Thus, the prior art teaches away from adding a resistor 316 between the gate and source of the first n-channel transistor 330. Putting a diode alone between the source and gate of the first n-channel transistor 330 will allow significant current to pass through, which necessitates a larger diode to handle the current. Adding resistance limits the current, and thus enables the use of a very small diode 318, which has negligible impact on performance.

The gate to source of the first n-channel transistor 330 may be modeled as a capacitor 342 in series with the degeneration inductor 338. During an electrostatic discharge (ESD) event, the capacitor 342 in series with the degeneration inductor 338 may resonate, building up a voltage Vgs from the gate-to-source of the first n-channel transistor 330 that is higher than the voltage difference between Vin and the local ground node 340 Vin–Vgnd. This higher voltage may cause the first n-channel transistor 330 to fail.

Figure 4:
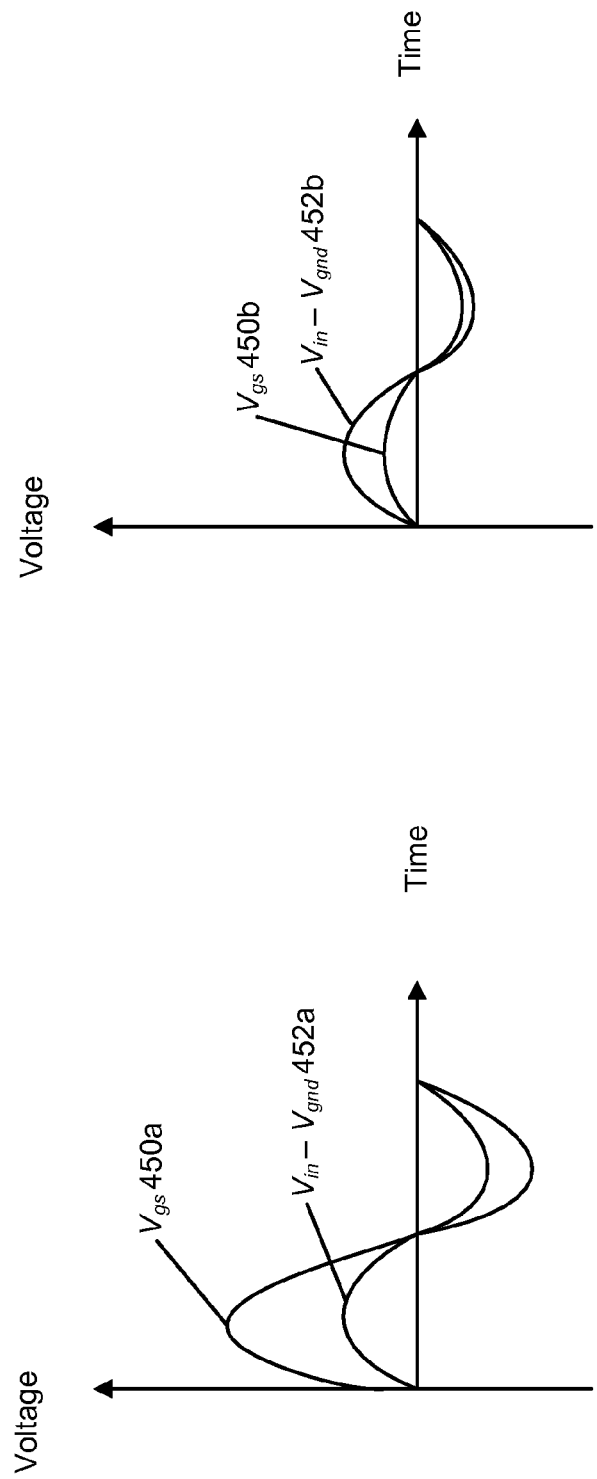
FIG. 4 is a graph illustrating +ve charged-device model (CDM) voltages for normal charged-device model (CDM) protection circuitry and for charged-device model (CDM) protection circuitry that includes de-Q circuitry, during a +ve charged-device model (CDM) test.

The de-Q circuitry 314 limits current through the parasitic path (from the source of the first n-channel transistor 330 to the gate of the first n-channel transistor 330 via the parasitic capacitance Cgs 342), enabling the use of a smaller diode 318 to minimize the parasitic capacitance Cgs 342. Because current cannot travel through the de-Q circuitry 314, the de-Q circuitry 314 (including the resistor 316) reduces the voltage Vgs from the gate of the first n-channel transistor 330 to the source of the first n-channel transistor 330 (and forces the current to go through the actual electrostatic discharge (ESD) protection path (i.e., the +ve diode 324)), thereby keeping the voltage Vgs below Vin–Vgnd. This is illustrated in FIG. 4. Keeping the voltage Vgs below Vin–Vgnd avoids failures of the first n-channel transistor 330 due to the +ve charged-device model (CDM) path.

FIG. 4 is a graph illustrating +ve charged-device model (CDM) voltages for normal charged-device model (CDM) protection circuitry and for charged-device model (CDM) protection circuitry 112 that includes de-Q circuitry 114, during a +ve charged-device model (CDM) test. In the normal charged-device model (CDM) protection circuitry, during +ve charged-device model (CDM) testing, the voltage Vgs 450a swings much higher than Vin–Vgnd 452a, resulting in failure of the first n-channel transistor 330. In the charged-device model (CDM) protection circuitry 112 that includes de-Q circuitry 114, during charged-device model (CDM) testing, the voltage Vgs 450b is always less than Vin–Vgnd 452b (and thus less than the breakdown voltage), preventing failure of the first n-channel transistor 330.

Figure 5:
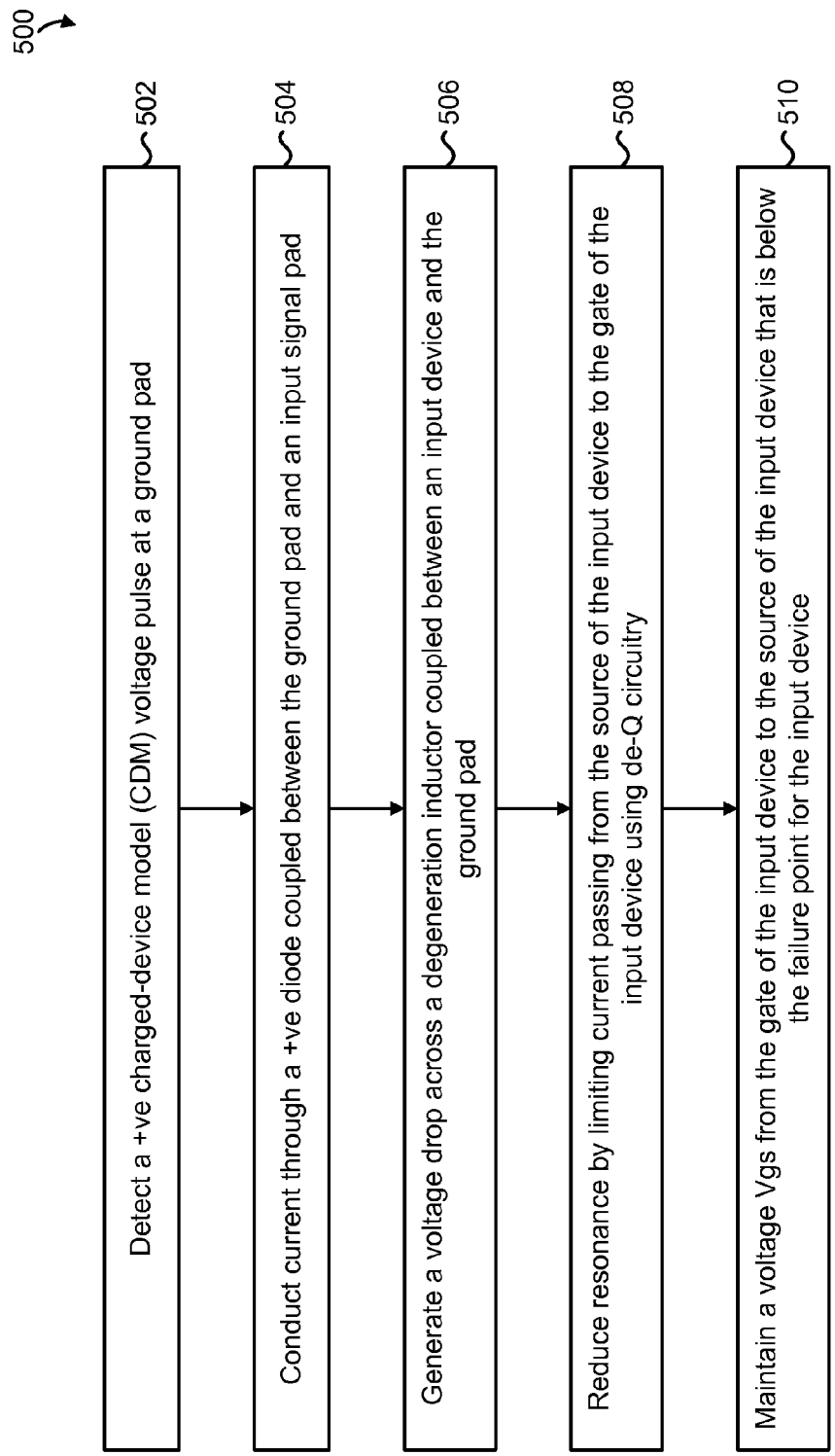
FIG. 5 is a flow diagram of a method for providing electrostatic discharge (ESD) protection.

FIG. 5 is a flow diagram of a method 500 for providing electrostatic discharge (ESD) protection. Specifically, the method 500 may provide electrostatic discharge (ESD) protection for +ve charged-device model (CDM) testing. The method 500 may be performed by a radio frequency integrated circuit (RFIC) 104 that includes charged-device model (CDM) protection circuitry 112. The charged-device model (CDM) protection circuitry 112 may include de-Q circuitry 114. The de-Q circuitry 114 may include a resistor 116 and a diode 118.

The radio frequency integrated circuit (RFIC) 104 may detect 502 a +ve charged-device model (CDM) voltage difference between the ground pad 110 and the input pad 108. The radio frequency integrated circuit (RFIC) 104 may conduct 504 current through a +ve diode 124 coupled between the ground pad 110 and an input signal pad 108. The radio frequency integrated circuit (RFIC) 104 may generate 506 a voltage drop across a degeneration inductor 338 coupled between an input device 128 and the ground pad 110. The potential difference between the ground pad 110 and the input pad 108 may create resonance between the parasitic capacitance Cgs 342 and the degeneration inductor 338. The resonance may create a large swing at the source node. The radio frequency integrated circuit (RFIC) 104 may limit reduce 508 the resonance by limiting current passing from the source of the input device 128 to the gate of the input device 128 using the de-Q circuitry 114. The radio frequency integrated circuit (RFIC) 104 may maintain 510 a voltage Vgs from the gate of the input device 128 to the source of the input device 128 that is below the failure point of the input device 128 (i.e., approximately 7 V).

Figure 6:
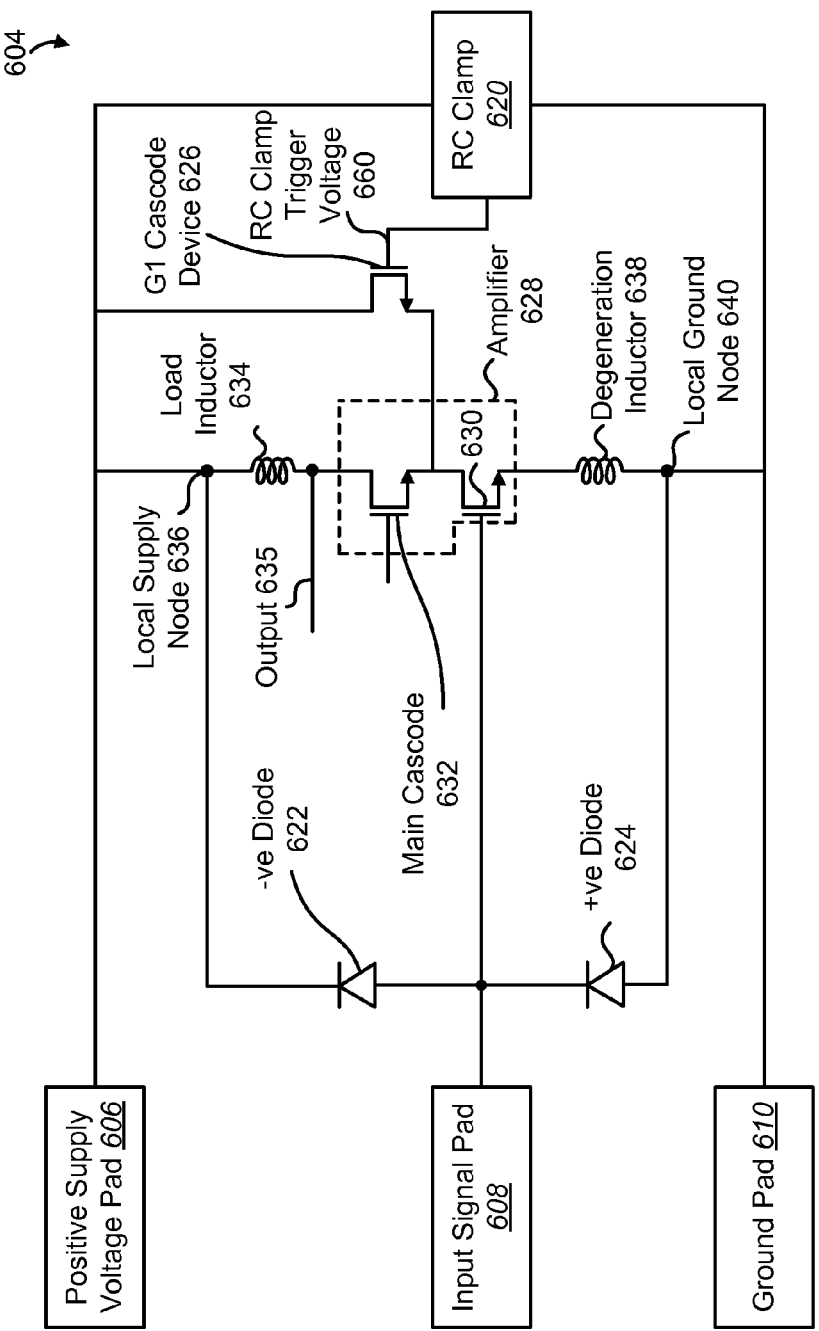
FIG. 6 is a circuit diagram of a radio frequency integrated circuit (RFIC) that includes a G1 cascode.

FIG. 6 is a circuit diagram of a radio frequency integrated circuit (RFIC) 604 that includes a G1 cascode device 626. The radio frequency integrated circuit (RFIC) 604 of FIG. 6 may be one configuration of the radio frequency integrated circuit (RFIC) 104 of FIG. 1. The radio frequency integrated circuit (RFIC) 604 may be a receiver low noise amplifier (LNA). The radio frequency integrated circuit (RFIC) 604 of FIG. 6 does not include models of parasitics that may occur in an integrated circuit. The radio frequency integrated circuit (RFIC) 604 may also include an amplifier 628 (i.e., an input device 128), a positive supply voltage pad 606, an input signal pad 608, a ground pad 610, a +ve diode 624, a −ve diode 622, an RC clamp 620, a load inductor 634 and a degeneration inductor 638. The amplifier 628 may include a first n-channel transistor 630 and a second n-channel transistor 632. The second n-channel transistor 632 may be referred to as the main cascode device.

The drain of the second n-channel transistor 630 may be coupled to the load inductor 634. Between the load inductor 634 and the drain of the second n-channel transistor 632 is the output 635 of the radio frequency integrated circuit (RFIC) 604, which may be provided to a downconverter. The load inductor 634 may be coupled to a local supply node 636. The positive supply voltage pad 606 may also be coupled to the local supply node 636. The cathode of the −ve diode 622 may further be coupled to the local supply node 636. The anode of the −ve diode 622 may be coupled to the input signal pad 608. The input signal pad 608 may also be coupled to the cathode of the +ve diode 624. The anode of the +ve diode 624 may be coupled to a local ground node 640. The ground pad 610 may also be coupled to the local ground node 640. The input signal pad 608 may further be coupled to the gate of the first n-channel transistor 630. The degeneration inductor 638 may be coupled between the source of the first n-channel transistor 630 and the local ground node 640.

The drain of the first n-channel transistor 630 may be coupled to the source of the second n-channel transistor 632. The gate of the second n-channel transistor 632 may be coupled to a DC biasing voltage. The RC clamp 620 may be coupled between the local supply node 636 and the local ground node 640.

The drain of the G1 cascode device 626 may be coupled to the local supply node 636 (the G1 cascode device 626 may be an n-channel transistor). The source of the G1 cascode device 626 may be coupled to the source of the second n-channel transistor 632. The gate of the G1 cascode device 626 may be coupled to an RC clamp trigger voltage 660 provided by the RC clamp 620. The function of the G1 cascode device 626 in the radio frequency integrated circuit (RFIC) 604 during a −ve charged-device model (CDM) test is discussed below in relation to FIG. 7 (note the G1 cascode device 726).

During −ve charged-device model (CDM) testing, the gate of the first n-channel transistor 630 is at a higher potential than the drain and source of the first n-channel transistor 630. The drain and source of the first n-channel transistor 630 eventually get charged through the local ground node 640 (with current coming through the RC clamp 620). By adding the G1 cascode device 626, another discharge path is created, which goes through the main device (the first n-channel transistor 630) itself. As the G1 cascode device 626 pulls the drain of the first n-channel transistor 630 up to the same potential as the local supply node 636, the potential at the drain of the first n-channel transistor 630 is only one diode drop (the −ve diode 622) away from the potential of the gate of the first n-channel transistor 630. Thus, the first n-channel transistor 630 gets forward biased, creating both an additional path for charging the local ground node 640 and reducing the gate to drain voltage and gate to source voltage for the first n-channel transistor 630, thus improving the charged-device model (CDM) performance. In other words, the G1 cascode device 626 may be any circuit that can create low impedance between the local supply node 636 and the local ground node 640 when the RC clamp trigger voltage 660 is high. Thus, although an n-channel transistor is shown as the G1 cascode device 626, other circuitry may also be used to implement the G1 cascode device 626.

Figure 7:
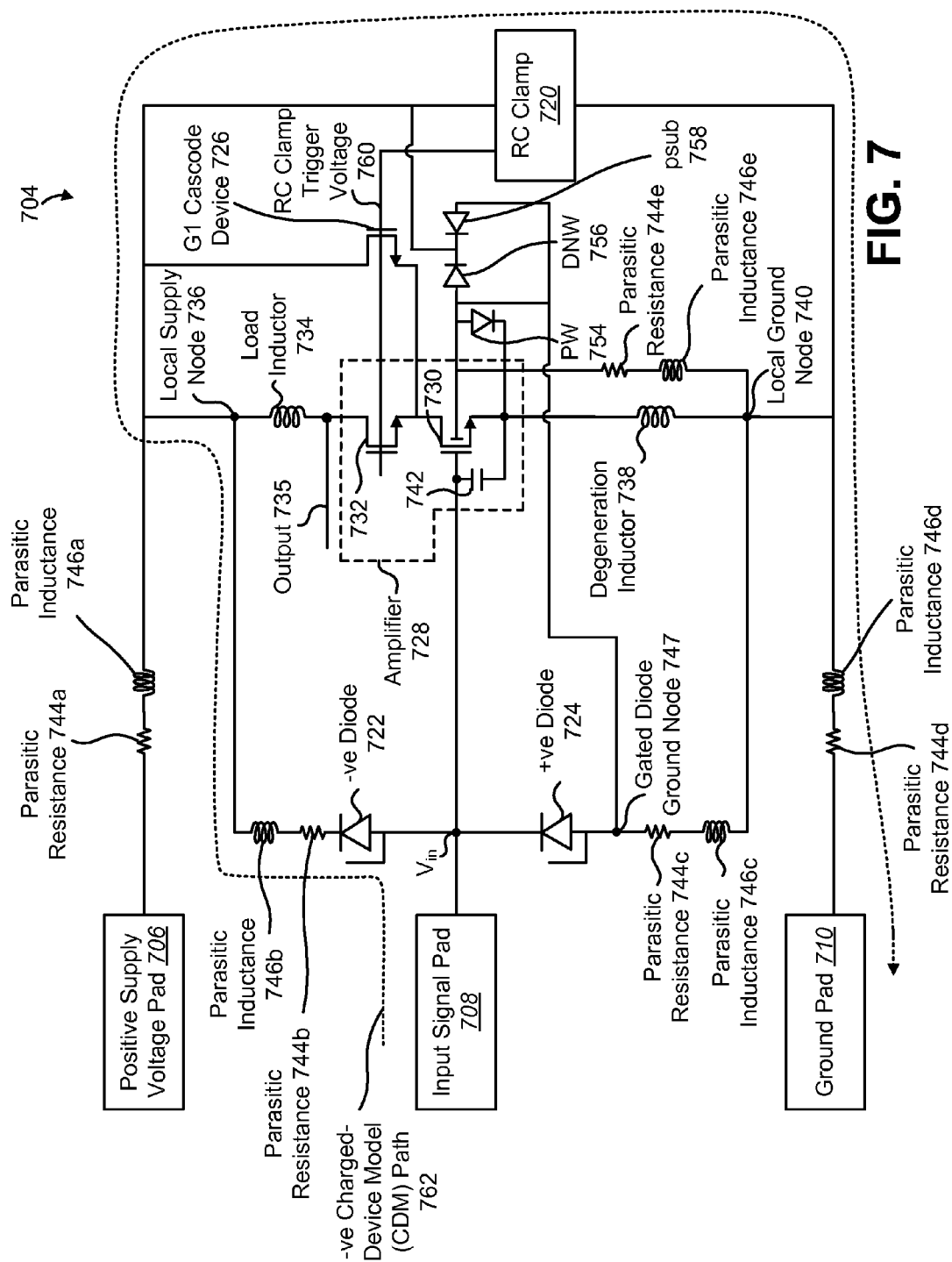
FIG. 7 is a more detailed circuit diagram of a radio frequency integrated circuit (RFIC) that includes a G1 cascode.

FIG. 7 is a more detailed circuit diagram of a radio frequency integrated circuit (RFIC) 704 that includes a G1 cascode. Specifically, the radio frequency integrated circuit (RFIC) 704 of FIG. 7 includes parasitics that are inherent in an integrated circuit. The radio frequency integrated circuit (RFIC) 704 may be a receiver low noise amplifier (LNA). The radio frequency integrated circuit (RFIC) 704 may include an amplifier 728 (i.e., an input device 128), a positive supply voltage pad 706, an input signal pad 708, a ground pad 710, a +ve diode 724, a −ve diode 722, an RC clamp 720, a G1 cascode device 726, a load inductor 734 and a degeneration inductor 738. The amplifier 728 may include a first n-channel transistor 730 and a second n-channel transistor 732. The second n-channel transistor 732 may be referred to as the main cascode device. The parasitics illustrated in FIG. 7 are only models and do not represent actual components within the radio frequency integrated circuit (RFIC) 704. The −ve charged-device model (CDM) path 762 is illustrated from the input signal pad 708 to the ground pad 710.

The load inductor 734 may be coupled between the drain of the second n-channel transistor 732 and a local supply node 736. Between the load inductor 734 and the drain of the second n-channel transistor 732 is the output 735 of the radio frequency integrated circuit (RFIC) 704, which may be provided to a downconverter. The local supply node 736 may be coupled to the positive supply voltage pad 706 via a coupling wire that includes a parasitic resistance 744a and a parasitic inductance 746a. Because the passive components in an integrated circuit (e.g., the inductors) are typically much larger than the active components (e.g., the transistors), the wires used to couple components on the radio frequency integrated circuit (RFIC) 704 may include significant parasitic resistance and significant parasitic capacitance (depending on the length of coupling wires).

The cathode of the −ve diode 722 may be coupled to the local supply node 736 via a coupling wire that includes a parasitic inductance 746b and a parasitic resistance 744b. The anode of the −ve diode 722 may be coupled to the input signal pad 708. The voltage at the input signal pad 708 may be the voltage Vin. The input signal pad 708 may also be coupled to the cathode of the +ve diode 724. The anode of the +ve diode 724 may be coupled to a local ground node 740 via a coupling wire that includes a parasitic resistance 744c and a parasitic inductance 746c. The voltage at the anode of the +ve diode 724 may be referred to as the diode ground 747. The voltage at the local ground node 740 may be referred to as Vgnd.

The ground pad 710 may be coupled to the local ground node 740 via a coupling wire that includes a parasitic resistance 744d and a parasitic inductance 746d. The degeneration inductor 738 may be coupled between the local ground node 740 and the source of the first n-channel transistor 730. The input signal pad 708 may also be coupled to the gate of the first n-channel transistor 730. The body of the first n-channel transistor 730 may be coupled to the anode of a parasitic diode DNW 756. The cathode of the parasitic diode DNW 756 may be coupled to the local supply node 736. The body of the first n-channel transistor 730 may also be coupled to the anode of a parasitic diode PW 754. The cathode of the parasitic diode PW 754 may be coupled to the source of the first n-channel transistor 730. The body of the first n-channel transistor 730 may be coupled to the local ground node 740 via a coupling wire that includes a parasitic resistance 744e and a parasitic inductance 746e.

Here, the parasitic diode DNW 756 represents the p-n junction diode formed between the p-type body and the n-type nwell. The parasitic diode psub 358 represents the p-n junction diode formed between the p-type substrate and the deep nwell.

The anode of the +ve diode 724 may be coupled to the anode of a parasitic diode psub 758. The cathode of the parasitic diode psub 758 may be coupled to the cathode of the parasitic diode DNW 756.

The drain of the first n-channel transistor 730 may be coupled to the source of the second n-channel transistor 732. The RC clamp 720 may be coupled between the local supply node 736 and the local ground node 740. A parasitic capacitance Cgs 742 may occur between the source of the first n-channel transistor 730 and the gate of the first n-channel transistor 730.

The gate of the G1 cascode device 726 may be coupled to the RC clamp trigger voltage 760 from the RC clamp 720. The source of the G1 cascode device 726 may be coupled to the source of the second n-channel transistor 732. The drain of the G1 cascode device 726 may be coupled to the local supply node 736.

In a −ve charged-device model (CDM) event, the voltage between the gate and the source of the first n-channel transistor 730 builds up larger values than during a +ve charged-device model (CDM) event, since the charged-device model (CDM) discharge current needs to flow through the −ve diode 722, the RC clamp 720 and the parasitic inductances 746. The current through the degeneration inductor 738 is small; consequently there is not much voltage drop across the degeneration inductor 738. Instead, the entire voltage (or most of it) appears across the parasitic capacitance Cgs 742, causing the amplifier 728 to fail.

If the gate of the main cascode (i.e., the second n-channel transistor 732) is coupled to the RC clamp trigger voltage 760, the −ve charged-device model (CDM) event may turn on the amplifier 728, increasing the source potential of the first n-channel transistor 730, and thereby protecting the gate-to-source of the first n-channel transistor 730. In this implementation, the load inductor 734 limits the current.

If the gate of the G1 cascode device 726 is coupled to the RC clamp trigger voltage 760, the −ve charged-device model (CDM) event may turn on the amplifier 728, increasing the source potential of the first n-channel transistor 730, and thereby protecting the gate-to-source of the first n-channel transistor 730. Because the G1 cascode device 726 is used instead of the main cascode, the current is not limited by the load inductor 734, leading to a substantial improvement in charged-device model (CDM) performance. The charged-device model (CDM) performance may be better than the improvements seen with forward based diodes. Thus, the G1 cascode device 726 is the preferred option for 28 nanometer (nm) and lower technology nodes.

Figure 8:
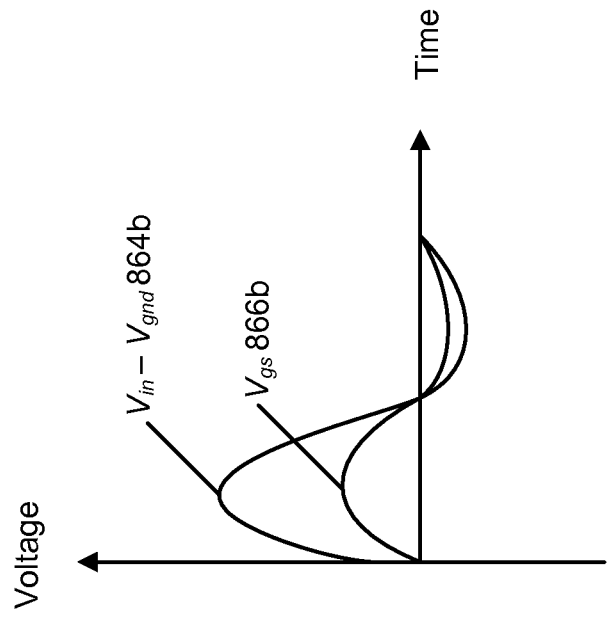
FIG. 8 is a graph illustrating −ve charged-device model (CDM) voltages for normal charged-device model (CDM) protection circuitry and for charged-device model (CDM) protection circuitry that includes a G1 cascode device.
Figure 8:
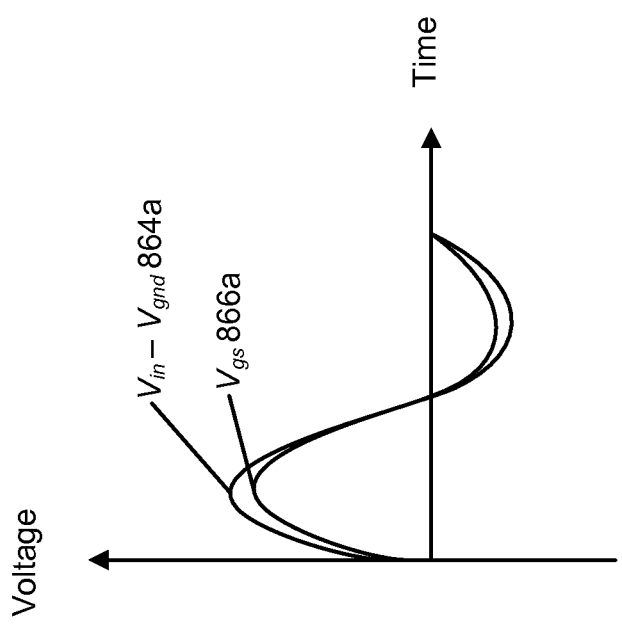

FIG. 8 is a graph illustrating −ve charged-device model (CDM) voltages for normal charged-device model (CDM) protection circuitry and for charged-device model (CDM) protection circuitry 112 that includes a G1 cascode device 126. In the normal charged-device model (CDM) protection circuitry, during −ve charged-device model (CDM) testing, the voltage Vgs 866a swings almost as high as Vin−Vgnd 864a, resulting in failure of the first n-channel transistor 730. In the charged-device model (CDM) protection circuitry 112 that includes a G1 cascode device 726, during −ve charged-device model (CDM) testing, the voltage Vgs 866b is much lower than Vin−Vgnd 864b, preventing failure of the first n-channel transistor 730.

Figure 9:
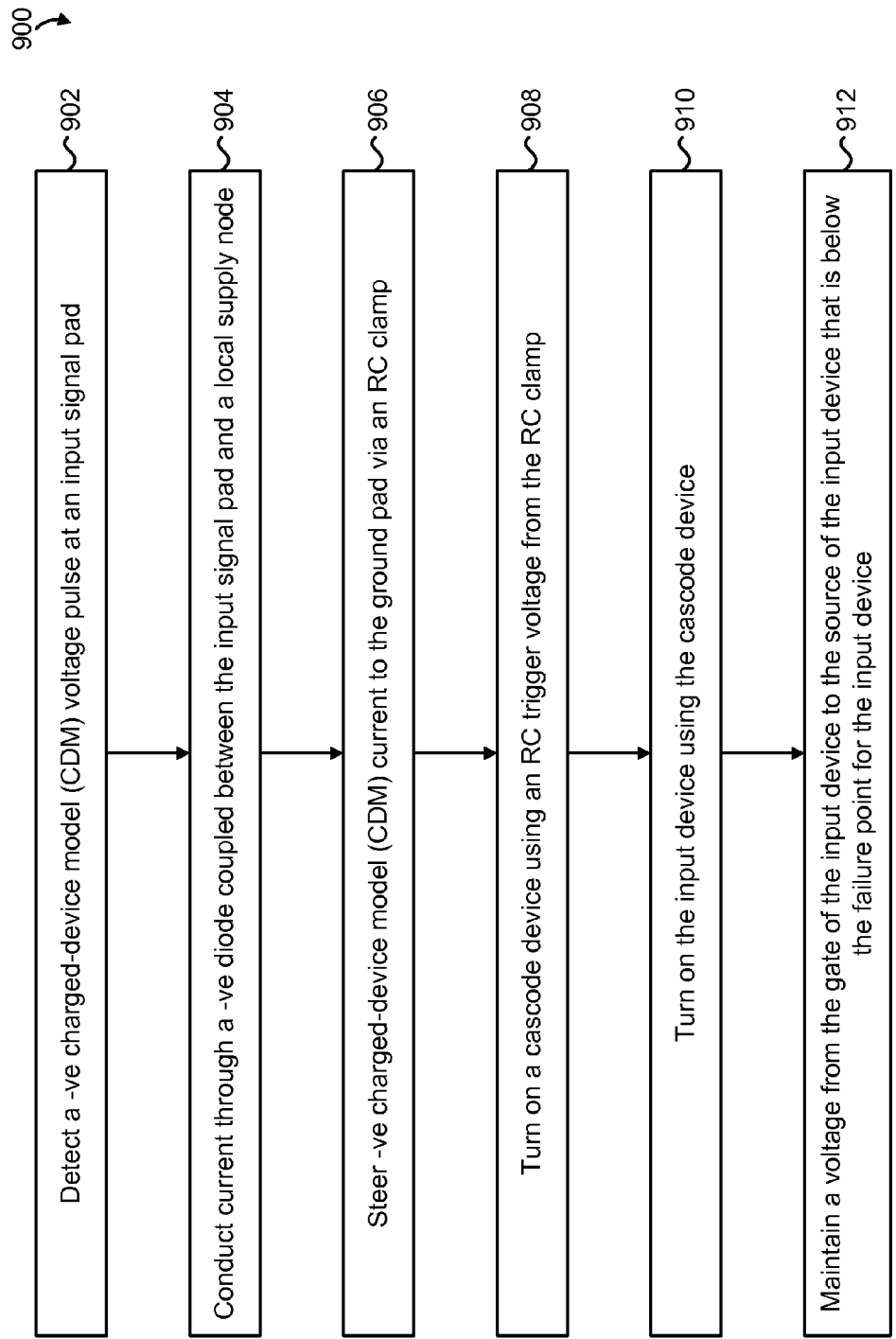
FIG. 9 is a flow diagram of another method for providing electrostatic discharge (ESD) protection.

FIG. 9 is a flow diagram of another method 900 for providing electrostatic discharge (ESD) protection. Specifically, the method 900 may provide electrostatic discharge (ESD) protection for −ve charged-device model (CDM) testing. The method 900 may be performed by a radio frequency integrated circuit (RFIC) 104 that includes charged-device model (CDM) protection circuitry 112. The charged-device model (CDM) protection circuitry 112 may include a G1 cascode device 126.

The radio frequency integrated circuit (RFIC) 104 may detect 902 a −ve charged-device model (CDM) voltage pulse at an input signal pad 108. The radio frequency integrated circuit (RFIC) 104 may conduct 904 current through a −ve diode 122 coupled between the input signal pad 108 and a local supply node 736. The radio frequency integrated circuit (RFIC) 104 may steer 906 −ve charged-device model (CDM) current to the ground pad 110 via an RC clamp 720. The radio frequency integrated circuit (RFIC) 104 may turn on 908 a cascode device using an RC clamp trigger voltage 760 from the RC clamp 720. The cascode device may be a main cascode or a G1 cascode device 726. The radio frequency integrated circuit (RFIC) 104 may turn on 910 the input device 128 using the cascode device. The radio frequency integrated circuit (RFIC) 104 may maintain 912 a voltage from the gate of the input device 128 to the source of the input device 128 that is below the failure point for the input device 128.

Figure 10:
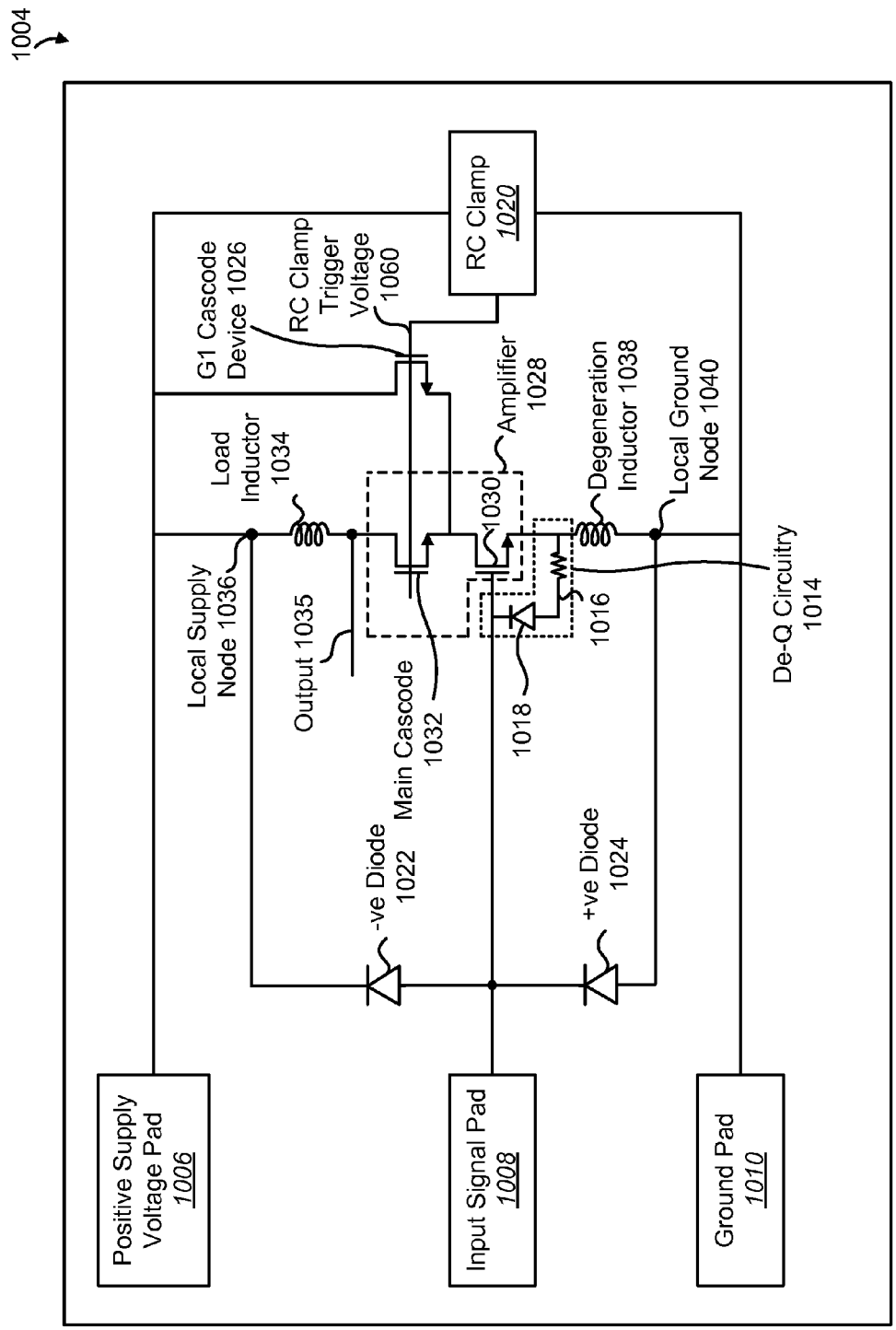
FIG. 10 is a circuit diagram of a radio frequency integrated circuit (RFIC) that includes both de-Q circuitry and a G1 cascode device.

FIG. 10 is a circuit diagram of a radio frequency integrated circuit (RFIC) 1004 that includes both de-Q circuitry 1014 and a G1 cascode device 1026. The radio frequency integrated circuit (RFIC) 1004 of FIG. 10 may be one configuration of the radio frequency integrated circuit (RFIC) 104 of FIG. 1. The radio frequency integrated circuit (RFIC) 1004 of FIG. 10 does not include models of parasitics that may occur in an integrated circuit. The radio frequency integrated circuit (RFIC) 1004 may be a receiver low noise amplifier (LNA). The radio frequency integrated circuit (RFIC) 104 may also include an amplifier 1028 (i.e., an input device 128), a positive supply voltage pad 1006, an input signal pad 1008, a ground pad 1010, a +ve diode 1024, a −ve diode 1022, an RC clamp 1020, a load inductor 1034 and a degeneration inductor 1038. The amplifier 1028 may include a first n-channel transistor 1030 and a second n-channel transistor 1032. The second n-channel transistor 1032 may be referred to as the main cascode device.

The load inductor 1034 may be coupled between the drain of the second n-channel transistor 1032 and a local supply node 1036. Between the load inductor 1034 and the drain of the second n-channel transistor 1032 is the output 1035 of the radio frequency integrated circuit (RFIC) 1004, which may be provided to a downconverter. The positive supply voltage pad 1006 may also be coupled to the local supply node 1036. The cathode of the −ve diode 1022 may also be coupled to the local supply node 1036. The anode of the −ve diode 1022 may be coupled to the input signal pad 1008. The input signal pad 1008 may also be coupled to the cathode of the +ve diode 1024. The anode of the +ve diode 1024 may be coupled to a local ground node 1040. The input signal pad 1008 may further be coupled to the gate of the first n-channel transistor 1030. The ground pad 1010 may also be coupled to the local ground node 1040. The degeneration inductor 1038 may be coupled between the source of the first n-channel transistor 1030 and the local ground node 1040.

The drain of the first n-channel transistor 1030 may be coupled to the source of the second n-channel transistor 1032. The RC clamp 1020 may be coupled between the local supply node 1036 and the local ground node 1040. The de-Q circuitry 1014 may include a resistor 1016 and a diode 1018 in series. The diode 1018 may be reverse biased during normal operation, with a negligible impact on the receiver performance. The resistor 1016 may be coupled between the source of the first n-channel transistor 1030 and the anode of the diode 1018. The cathode of the diode 1018 may be coupled to the gate of the first n-channel transistor 1030.

The drain of the G1 cascode device 1026 may be coupled to the local supply node 1036 (the G1 cascode device 1026 may be an n-channel transistor). The source of the G1 cascode device 1026 may be coupled to the source of the main cascode. The gate of the G1 cascode device 1026 may be coupled to an RC clamp trigger voltage 1060 provided by the RC clamp 1020. The RC clamp trigger voltage 1060 may also be coupled to the gate of the main cascode (i.e., the gate of the second n-channel transistor 1032). The function of the G1 cascode 1026 in the radio frequency integrated circuit (RFIC) 1004 during a −ve charged-device model (CDM) test is the same as that discussed above in relation to FIG. 6. The function of the de-Q circuitry 1014 during a +ve charged-device model (CDM) test is the same as that discussed above in relation to FIG. 3.

Figure 11:
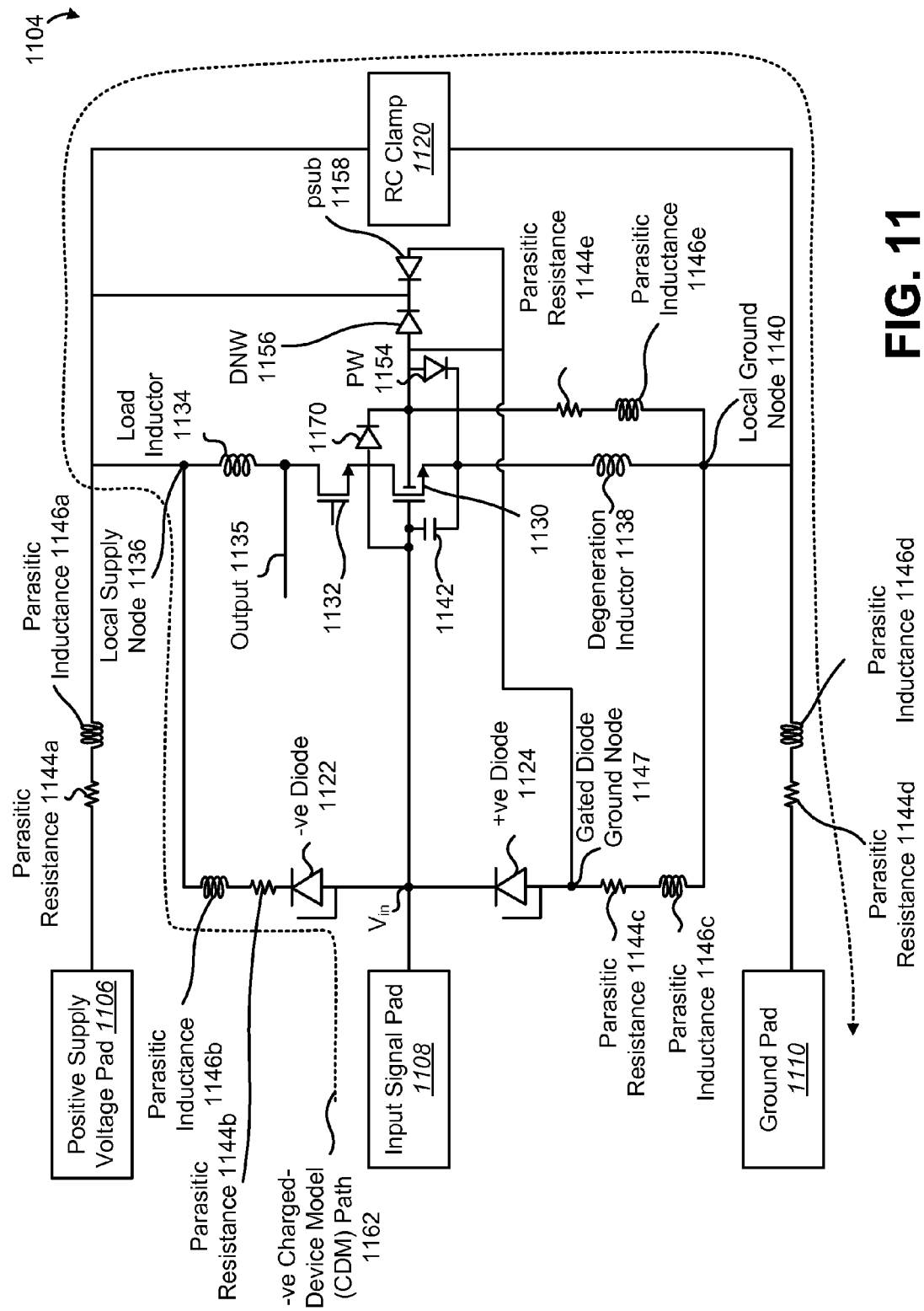
FIG. 11 is a more detailed circuit diagram of a radio frequency integrated circuit (RFIC) that includes a forward biased diode.

FIG. 11 is a more detailed circuit diagram of a radio frequency integrated circuit (RFIC) 1104 that includes a forward biased diode 1170. Specifically, the radio frequency integrated circuit (RFIC) 1104 of FIG. 11 includes parasitics that are inherent in an integrated circuit. The radio frequency integrated circuit (RFIC) 1104 may be a receiver low noise amplifier (LNA). The radio frequency integrated circuit (RFIC) 1104 may include an amplifier (i.e., an input device 128), a positive supply voltage pad 1106, an input signal pad 1108, a ground pad 1110, a +ve diode 1124, a −ve diode 1122, an RC clamp 1120, a forward biased diode 1170, a load inductor 1134 and a degeneration inductor 1138. The amplifier may include a first n-channel transistor 1130 and a second n-channel transistor 1132. The second n-channel transistor 1132 may be referred to as the main cascode device. The parasitics illustrated in FIG. 11 are only models and do not represent actual components within the radio frequency integrated circuit (RFIC) 1104. The −ve charged-device model (CDM) path 1162 is illustrated from the input signal pad 1108 to the ground pad 1110.

The load inductor 1134 may be coupled between the drain of the second n-channel transistor 1132 and a local supply node 1136. Between the load inductor 1134 and the drain of the second n-channel transistor 1132 is the output 1135 of the radio frequency integrated circuit (RFIC) 1104, which may be provided to a downconverter. The local supply node 1136 may be coupled to the positive supply voltage pad 1106 via a coupling wire that includes a parasitic resistance 1144a and a parasitic inductance 1146a. Because the passive components in an integrated circuit (e.g., the inductors) are typically much larger than the active components (e.g., the transistors), the wires used to couple components on the radio frequency integrated circuit (RFIC) 1104 may include significant parasitic resistance and significant parasitic capacitance (depending on the length of coupling wires).

The cathode of the −ve diode 1122 may be coupled to the local supply node 1136 via a coupling wire that includes a parasitic inductance 1146b and a parasitic resistance 1144b. The anode of the −ve diode 1122 may be coupled to the input signal pad 1108. The voltage at the input signal pad 1108 may be the voltage Vin. The input signal pad 1108 may also be coupled to the cathode of the +ve diode 1124. The anode of the +ve diode 1124 may be coupled to a local ground node 1140 via a coupling wire that includes a parasitic resistance 1144c and a parasitic inductance 1146c. The voltage at the anode of the +ve diode 1124 may be referred to as the diode ground node 1147. The voltage at the local ground node 1140 may be referred to as Vgnd.

The ground pad 1110 may be coupled to the local ground node 1140 via a coupling wire that includes a parasitic resistance 1144d and a parasitic inductance 1146d. The degeneration inductor 1138 may be coupled between the local ground node 1140 and the source of the first n-channel transistor 1130. The input signal pad 1108 may also be coupled to the gate of the first n-channel transistor 1130. The body of the first n-channel transistor 1130 may be coupled to the anode of a parasitic diode DNW 1156. The cathode of the parasitic diode DNW 1156 may be coupled to the local supply node 1136. The body of the first n-channel transistor 1130 may also be coupled to the anode of a parasitic diode PW 1154. The cathode of the parasitic diode PW 1154 may be coupled to the source of the first n-channel transistor 1130. The body of the first n-channel transistor 1130 may be coupled to the local ground node 1140 via a coupling wire that includes a parasitic resistance 1144e and a parasitic inductance 1146e.

The anode of the +ve diode 1124 may be coupled to the anode of a parasitic diode psub 1158. The cathode of the parasitic diode psub 1158 may be coupled to the cathode of the parasitic diode DNW 1156.

The drain of the first n-channel transistor 1130 may be coupled to the source of the second n-channel transistor 1132. The RC clamp 1120 may be coupled between the local supply node 1136 and the local ground node 1140. A parasitic capacitance Cgs 1142 may occur between the source of the first n-channel transistor 1130 and the gate of the first n-channel transistor 1130. The anode of the forward biased diode 1170 may be coupled to the input signal pad 1108. The cathode of the forward biased diode 1170 may be coupled to the body of the first n-channel transistor 1130.

The forward biased diode 1170 may provide another way to clamp the voltage between the gate of the first n-channel transistor 1130 and the body of the first n-channel transistor 1130. This provides additional protection against breakdown of the first n-channel transistor 1130. During a −ve charged-device model (CDM) event, the input signal pad 1108 (and thus the gate of the first n-channel transistor 1130) is at ground potential, while the ground pad 1110 is charged to a voltage of −ve. The body of the first n-channel transistor 1130, which is shorted to the local ground node 1140, is also at a lower potential. Thus, the diode 1170 is forward biased, helping to quickly charge up the local ground node 1140, thereby reducing the potential difference between the gate and the diffusion regions of the first n-channel transistor 1130. Reducing the potential difference between the gate and the diffusion regions may also cause the PW diode 1154 to become forward biased, which also charges up the source of the first n-channel transistor 1130.

Figure 12:
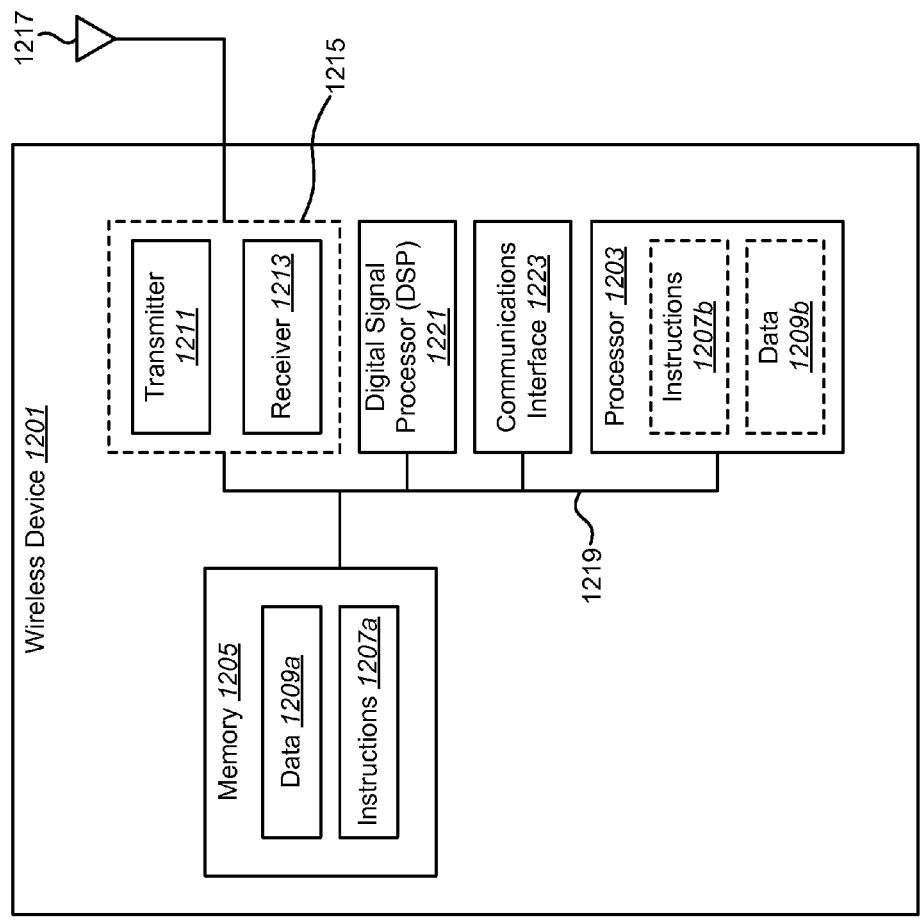
FIG. 12 illustrates certain components that may be included within a wireless device.

FIG. 12 illustrates certain components that may be included within a wireless device 1201. The wireless device 1201 of FIG. 12 may be one configuration of the wireless device 102 of FIG. 1. A wireless device 1201 may also be referred to as, and may include some or all of the functionality of, an access point, a broadcast transmitter, a NodeB, an evolved NodeB, a base station, an access terminal, a mobile station, a user equipment (UE), etc. The wireless device 1201 includes a processor 1203. The processor 1203 may be a general purpose single- or multi-chip microprocessor (e.g., an ARM), a special purpose microprocessor (e.g., a digital signal processor (DSP)), a microcontroller, a programmable gate array, etc. The processor 1203 may be referred to as a central processing unit (CPU). Although just a single processor 1203 is shown in the wireless device 1201 of FIG. 12, in an alternative configuration, a combination of processors (e.g., an ARM and DSP) could be used.

The wireless device 1201 also includes memory 1205. The memory 1205 may be any electronic component capable of storing electronic information. The memory 1205 may be embodied as random access memory (RAM), read-only memory (ROM), magnetic disk storage media, optical storage media, flash memory devices in RAM, on-board memory included with the processor, EPROM memory, EEPROM memory, registers, and so forth, including combinations thereof.

Data 1209a and instructions 1207a may be stored in the memory 1205. The instructions 1207a may be executable by the processor 1203 to implement the methods disclosed herein. Executing the instructions 1207a may involve the use of the data 1209a that is stored in the memory 1205. When the processor 1203 executes the instructions 1207a, various portions of the instructions 1207b may be loaded onto the processor 1203, and various pieces of data 1209b may be loaded onto the processor 1203.

The wireless device 1201 may also include a transmitter 1211 and a receiver 1213 to allow transmission and reception of signals to and from the wireless device 1201. The transmitter 1211 and receiver 1213 may be collectively referred to as a transceiver 1215. An antenna 1217 may be electrically coupled to the transceiver 1215. The wireless device 1201 may also include (not shown) multiple transmitters, multiple receivers, multiple transceivers and/or multiple antennas.

The wireless device 1201 may include a digital signal processor (DSP) 1221. The wireless device 1201 may also include a communications interface 1223. The communications interface 1223 may allow a user to interact with the wireless device 1201.

The various components of the wireless device 1201 may be coupled together by one or more buses, which may include a power bus, a control signal bus, a status signal bus, a data bus, etc. For the sake of clarity, the various buses are illustrated in FIG. 12 as a bus system 1219.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, subroutines, functions, procedures, etc. "Instructions" and "code" may comprise a single computer-readable statement or many computer-readable statements.

The functions described herein may be implemented in software or firmware being executed by hardware. The functions may be stored as one or more instructions on a computer-readable medium. The terms "computer-readable medium" or "computer-program product" refers to any tangible storage medium that can be accessed by a computer or a processor. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio and microwave, then the coaxial cable, fiber optic cable, twisted pair, DSL, or wireless technologies such as infrared, radio and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIG. 5 and FIG. 9, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read-only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods and apparatus described herein without departing from the scope of the claims.

What is claimed is:

1. An apparatus comprising:
an input device that includes an n-channel transistor;
a positive supply voltage pad;
an input signal pad;
a ground pad; and
a charged-device model protection circuit configured to protect the input device from an electrostatic discharge, wherein the charged-device model protection circuit comprises a de-Q circuit comprising a resistor and a diode in series between a gate and a source of the n-channel transistor and configured to cause an amplitude of a first voltage between the gate and the source to be kept below an amplitude of a second voltage applied between the input signal pad and the ground pad.

2. The apparatus of claim 1, wherein the resistor of the de-Q circuit is configured to limit an amount of current passing through a parasitic path between the gate and the source of the n-channel transistor, and wherein by limiting the amount of current through the parasitic path of the n-channel transistor, to cause a reduction in a parasitic capacitance between the gate and the source of the n-channel transistor, to prevent a resonance in the parasitic path, to reduce a voltage buildup between the gate of the n-channel transistor and the source of the n-channel transistor, and to cause the amplitude of the first voltage to be kept below the amplitude of the second voltage.

3. The apparatus of claim 2, wherein by preventing the resonance in the parasitic path, the de-Q circuit is configured to keep the first voltage below a voltage difference between the input signal pad and a local ground node on the apparatus.

4. The apparatus of claim 2, wherein the parasitic capacitance in the parasitic path between the gate and the source of the n-channel transistor includes a parasitic capacitance of the diode of the de-Q circuit and another parasitic capacitance between the gate and the source of the n-channel transistor in parallel to the de-Q circuit.

5. The apparatus of claim 1, wherein the resistor of the de-Q circuit is configured to cause an electrostatic discharge current to be directed through a +ve diode coupled between the ground pad and the input signal pad.

6. The apparatus of claim 5, wherein a resistance of the resistor is significantly greater than a parasitic resistance of the +ve diode.

7. The apparatus of claim 1, wherein a degeneration inductor is coupled to the source of the n-channel transistor, and wherein the de-Q circuit is configured to prevent a resonance from occurring between a gate-source capacitance of the n-channel transistor and the degeneration inductor.

8. The apparatus of claim 1, wherein the diode is reverse biased during normal operation.

9. The apparatus of claim 1, wherein a net resistance of the de-Q circuit includes a resistance of the resistor and a parasitic resistance.

10. The apparatus of claim 9, wherein the resistor is an actual component distinct from the parasitic resistance.

11. The apparatus of claim 1, wherein the de-Q circuit is configured to keep the source of the n-channel transistor as a low impedance node.

12. The apparatus of claim 1, wherein by keeping the amplitude of the first voltage below the second voltage, the electrostatic discharge does not turn the n-channel transistor on or off.

13. A method for electrostatic discharge protection, comprising:
 detecting a +ve voltage pulse at a ground pad;
 conducting a current through a +ve diode coupled between the ground pad and an input signal pad;
 generating a voltage drop across a degeneration inductor coupled between an input device and the ground pad, the input device including an n-channel transistor;
 limiting, by a de-Q circuit, an amount of current passing through a parasitic path between a source of the n-channel transistor to a gate of the n-channel transistor, wherein the de-Q circuit comprises a resistor and a diode in series between the gate and the source of the n-channel transistor;
 limiting the amount of current passing through the parasitic path by the resistor and causing a reduction of a parasitic capacitance between the gate and the source of the n-channel transistor; and
 causing an amplitude of a first voltage from the gate of the input device to the source of the input device to be maintained below an amplitude of a second voltage between the input signal pad and the ground pad.

14. The method of claim 13, wherein by limiting the amount of current through the parasitic path of the n-channel transistor, the de-Q circuit is configured to reduce a parasitic capacitance between the gate and the source of the n-channel transistor, preventing a resonance in the parasitic path, and reducing a voltage buildup between the gate of the n-channel transistor and the source of the n-channel transistor to cause the amplitude of the first voltage to be kept below the amplitude of the second voltage.

15. The method of claim 14, further including:
 keeping the first voltage below a voltage difference between the input signal pad and a local ground node.

16. The method of claim 13, further including:
 by limiting the current through the parasitic path, directing an electrostatic discharge current through the +ve diode.

17. An apparatus for electrostatic discharge protection, comprising:
 means for detecting a +ve voltage difference between a ground pad and an input signal pad;
 means for conducting current through a +ve diode coupled between the ground pad and the input signal pad;
 means for generating a voltage drop across a degeneration inductor coupled between an input device and the ground pad, the input device including an n-channel transistor;
 means for limiting current passing through a parasitic path between a source of the n-channel transistor to a gate of the n-channel transistor;
 means for preventing a resonance in the parasitic path; and
 for maintaining an amplitude of a first voltage from the gate of the n-channel transistor to the source of the n-channel transistor below an amplitude of a second voltage between the input signal pad and the ground pad.

* * * * *